(12) United States Patent
Shimizu et al.

(10) Patent No.: US 7,767,378 B2
(45) Date of Patent: Aug. 3, 2010

(54) METHOD FOR PRODUCING RESIST COMPOSITION AND RESIST COMPOSITION

(75) Inventors: Hiroaki Shimizu, Kawasaki (JP); Masaru Takeshita, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 548 days.

(21) Appl. No.: 11/718,388

(22) PCT Filed: Nov. 4, 2005

(86) PCT No.: PCT/JP2005/020291

§ 371 (c)(1), (2), (4) Date: May 1, 2007

(87) PCT Pub. No.: WO2006/049246

PCT Pub. Date: May 11, 2006

(65) Prior Publication Data

US 2009/0029288 A1    Jan. 29, 2009

(30) Foreign Application Priority Data

Nov. 5, 2004  (JP) .............................. 2004-322315

(51) Int. Cl.
*G03F 7/039* (2006.01)
(52) U.S. Cl. ..................... 430/270.1; 430/326; 430/910
(58) Field of Classification Search ........................ None
See application file for complete search history.

(56) References Cited

U.S. PATENT DOCUMENTS

| 5,750,309 | A | 5/1998 | Hatakeyama et al. |
| 6,168,900 | B1 | 1/2001 | Itani |
| 2001/0033894 | A1 | 10/2001 | Nakamura et al. |
| 2003/0054286 | A1 | 3/2003 | Sato et al. |
| 2003/0087032 | A1 | 5/2003 | Sugeta et al. |
| 2003/0171490 | A1 | 9/2003 | Breyta et al. |
| 2004/0053170 | A1 | 3/2004 | Ijima et al. |
| 2004/0058269 | A1 | 3/2004 | Hada et al. |
| 2004/0072103 | A1 | 4/2004 | Sato et al. |
| 2004/0110085 | A1 | 6/2004 | Iwai et al. |
| 2004/0137378 | A1 | 7/2004 | Sugeta et al. |
| 2005/0095532 | A1* | 5/2005 | Kodama et al. .......... 430/270.1 |
| 2006/0014098 | A1 | 1/2006 | Hada et al. |
| 2006/0234154 | A1 | 10/2006 | Nishimura et al. |

FOREIGN PATENT DOCUMENTS

| JP | H09-244233 | 9/1997 |
| JP | 2000-112145 | 4/2000 |
| JP | 2002-148820 | 5/2002 |
| JP | 2002-303978 | 10/2002 |
| JP | 2003-005374 A | 1/2003 |
| JP | 2003-043690 A | 2/2003 |
| JP | 2003-107752 | 4/2003 |
| JP | 2003-167347 | 6/2003 |
| JP | 2003-202679 | 7/2003 |
| JP | 2003-241385 A | 8/2003 |
| JP | 2003-280201 A | 10/2003 |
| JP | 2003-292716 | 10/2003 |
| WO | WO 2005/116769 A1 | 5/2005 |

OTHER PUBLICATIONS

Office Action issued in counterpart Japanese Patent Application No. 2004-322315, dated Jan. 20, 2009.
Office Action issued Sep. 16, 2008 on the counterpart Japanese Patent Application No. 2004-322315.
International Search Report from PCT/JP2005/020291 dated Feb. 7, 2006.

* cited by examiner

*Primary Examiner*—Sin J. Lee
(74) *Attorney, Agent, or Firm*—Knobbe, Martens, Olson & Bear, LLP

(57) ABSTRACT

A method for producing a resist composition including a resin component (A) that exhibits changed alkali solubility under the action of acid and an acid generator component (B) that generates acid upon exposure, the method including the steps of: obtaining the component (A) by mixing a plurality of copolymers, which are composed of the same structural units but have mutually different measured values for the contact angle.

20 Claims, No Drawings

US 7,767,378 B2

METHOD FOR PRODUCING RESIST COMPOSITION AND RESIST COMPOSITION

RELATED APPLICATIONS

This application is the U.S. National Phase filing under 35 U.S.C. §371 of PCT/JP2005/020291, filed Nov. 4, 2005, which designated the United States and was published in a language other than English, which claims priority under 35 U.S.C. §119(a)-(d) to Japanese Patent Application No. 2004-322315, filed Nov. 5, 2004. The content of these applications is incorporated herein by reference in their entireties.

TECHNICAL FIELD

The present invention relates to a method for producing a resist composition, and a resist composition.

BACKGROUND ART

Chemically amplified photoresist compositions that use a KrF excimer laser, ArF excimer laser, $F_2$ excimer laser, EUV (extreme ultraviolet light) or EB (electron beam) or the like as a light source (a radiation source) generally include a resin component (A) and an acid generator component (B) that generates an acid upon irradiation dissolved in an organic solvent (C), as disclosed, for example, in Japanese Unexamined Patent Application, First Publication No. 2003-167347 (patent reference 1).

These types of photoresist compositions require favorable lithography characteristics (such as resolution, depth of focus properties, and resist pattern shape).

Moreover in recent years, as the demands for higher resolution resist patterns have increased, in addition to the characteristics described above, the photoresist compositions also require improvements beyond the conventionally observed level of defects (surface defects) within the developed resist pattern.

These defects refer to general abnormalities detected by inspection of the resist pattern following developing, from directly above the resist pattern, using a surface defect inspection device (brand name: KLA) from KLA Tencor Corporation. Examples of these abnormalities include post-developing scum, foam, dust, bridges across different portions of the resist pattern, color irregularities, and precipitated deposits.

Moreover in recent years, with the formation of very fine resist patterns of 130 nm or smaller using an ArF excimer laser or more recent light source, namely an ArF excimer laser, a $F_2$ excimer laser, EUV or EB or the like, the problem of resolving these defects has become even more critical.

[Patent Reference 1]
Japanese Unexamined Patent Application, First Publication No. 2003-167347

DISCLOSURE OF INVENTION

However, conventional resist compositions have been unable to adequately reduce the level of defects.

The present invention takes the above circumstances into consideration, with an object of providing a method for producing a resist composition and a resist composition that are capable of reducing the level of defects while maintaining favorable levels of lithography characteristics such as resolution and depth of focus (DOF).

In order to achieve the above object, the present invention adopts the aspects described below.

A first aspect of the present invention is a method for producing a resist composition including a resin component (A) that exhibits changed alkali solubility under the action of acid and an acid generator component (B) that generates acid upon exposure, the method including:

obtaining the component (A) by mixing a plurality of copolymers, which are composed of the same structural units but have mutually different measured values for the contact angle.

A second aspect of the present invention is a resist composition obtained by the method for producing a resist composition according to the first aspect.

In the present invention, the term "(α-lower alkyl)acrylate" is a generic term that includes α-lower alkyl acrylates such as methacrylate, and/or acrylate. The term "α-lower alkyl acrylate" refers to a structure in which the hydrogen atom bonded to the α-carbon atom of an acrylate has been substituted with a lower alkyl group.

The term "structural unit" refers to a monomer unit that contributes to the formation of a polymer.

The expression "structural unit derived from an acrylate" refers to a structural unit that is formed by cleavage of the ethylenic double bond of an acrylate ester.

The expression "structural unit derived from an α-lower alkyl acrylate" refers to a structural unit that is formed by cleavage of the ethylenic double bond of an α-lower alkyl acrylate ester.

The expression "structural unit derived from an (α-lower alkyl)acrylate" refers to a structural unit that is formed by cleavage of the ethylenic double bond of an (α-lower alkyl) acrylate ester.

Furthermore, the term "exposure" is used as a general concept that includes irradiation with any form of radiation.

The present invention is able to provide a method for producing a resist composition and a resist composition that are capable of reducing the level of defects.

BEST MODE FOR CARRYING OUT THE INVENTION

Method for Producing Resist Composition

A method for producing a resist composition according to the present invention is a method for producing a resist composition that includes a component (A) and a component (B), the method including obtaining the component (A) by mixing a plurality of copolymers, which are composed of the same structural units but have mutually different measured values for the contact angle.

As a result of intensive investigation, the inventors of the present invention discovered that the generation of defects is attributable to the contact angle at the surface of the resist film formed from a resist composition.

The contact angle is measured in the manner described below.

1) 1 ml of a resist composition solution with a solid fraction concentration of 8% by weight is spin coated at a rate of revolution of 1,500 rpm onto the surface of a silicon substrate having a diameter of 6 inches, and is then heated for 90 seconds at a temperature of 90° C.

2) Using a developing apparatus [product name: TD6133U (manufactured by Tazmo Co., Ltd.)], a 2.38% by weight aqueous solution of tetramethylammonium hydroxide (the alkali developing solution) is dripped onto the surface of the above resist film at a temperature of 23° C. for a period of 30 seconds, and the resist film is then spun dry for 20 seconds at a revolution rate of 1,500 rpm.

3) Using a FACE contact angle meter CA-X150 (a product name, manufactured by Kyowa Interface Science Co., Ltd.), the injector fitted to the apparatus is brought into contact with the dried resist film (on contact between the injector and the resist film, 2 µL of pure water is released onto the resist film surface), and the contact angle is measured.

In a resist composition, the level of defects can be reduced by ensuring that the measured value of the contact angle is preferably no higher than 40 degrees.

The lower limit for the contact angle is typically 25 degrees or greater, and contact angles of 30 degrees or greater are preferred.

A preferred contact angle value is within a range from 30 to 40 degrees, even more preferably from 32 to 40 degrees, even more preferably from 35 to 40 degrees, and is most preferably from 36 to 39 degrees. Ensuring the measured value of the contact angle is at least 35 degrees not only enables a reduction in the level of defects, but also enables favorable lithography characteristics such as resolution and DOF (depth of focus) to be obtained.

By mixing a plurality of copolymers that are composed of the same structural units, the value of the contact angle for a resist composition can be adjusted with ease. Here, the expression "the same structural units" refers to structural units of the same chemical structure.

Even with copolymers that are composed of the same structural units, (i) if the proportions of the structural units within each copolymer differ, then the measured values of the contact angle will differ for resist compositions formed using any one of the different copolymers as a sole component (A).

Furthermore, (ii) even in the case of a plurality of copolymers that are composed of the same structural units in the same proportions, changes in the production lot can result in the measured values of the contact angle differing for resist compositions formed using any one of the copolymers as a sole component (A). It is surmised that this observation probably reflects the fact that minor changes in the production conditions such as the temperature and the pressure cause bias within the distribution of the structural units that constitute the copolymer.

Here, when the contact angle values are measured for the respective resist compositions that each contain one of the "plurality of copolymers" as the component (A), the makeup of each resist composition is identical besides the component (A). In other words, the contact angle values for the respective resist compositions that each contain one of the copolymers as the component (A) are of the same composition as the final target resist composition, with the exception that a single copolymer accounts for 100% by weight of the component (A).

Furthermore, in the claims and the description of the present invention, the "measured value of the contact angle of a copolymer" refers to the value obtained by producing a resist composition in the same manner as the aforementioned final target resist composition but with the exception of using a single copolymer for 100% by weight of the component (A), and then measuring the contact angle for the resulting composition using the procedure described above.

Then by varying the mixing conditions, namely by varying the nature (the contact angle value) of each of the copolymers and the mixing ratio, a resist composition that exhibits a desirable measured value for the contact angle can be obtained.

For example, when a mixed resin produced by mixing a copolymer that exhibits a large value for the contact angle and a copolymer that exhibits a small value for the contact angle is used as the component (A), a resist composition that exhibits a desirable measured value for the contact angle can be obtained by altering the nature (the measured value for the contact angle value) of each of the copolymers and the mixing ratio between the copolymers.

As follows is a description of a specific example.

In this example, a first copolymer and a second copolymer are used.

These copolymers are formed using the same plurality of structural units, and the proportion of each of the structural units is the same within each copolymer, but the production lots for the copolymers are different.

First, factors relating to the composition of the target resist composition other than the mixing proportions of the first copolymer and the second copolymer are determined.

Subsequently, a first resist composition in which the component (A) is formed from 100% by weight of the first copolymer is prepared as the target resist composition.

The contact angle for this first resist composition is then measured in the manner described above. This measured value is deemed X1.

Similarly, using the second copolymer, a second resist composition is produced in which the component (A) is formed from 100% by weight of the second copolymer.

The contact angle for this second resist composition is also measured in the manner described above. This measured value is deemed X2.

The respective mixing proportions of the first copolymer and the second copolymer within a resist composition formed using a component (A) that contains a mixture of both copolymers are then calculated so that the measured value for the contact angle of the mixed resist composition is no higher than 40 degrees.

In other words, the proportions Y1 and Y2 are determined so as to satisfy the formula shown below.

$$[X1(°) \times Y1(\text{weight \%}) + X2(°) \times Y2(\text{weight \%})]/100 \leq 40 (°)$$

Y1 is the proportion (weight %) of the first copolymer within the component (A), and Y2 is the proportion (weight %) of the second copolymer within the component (A), wherein Y1+Y2=100.

If a resist composition is produced using a component (A) in which the first copolymer and the second copolymer are mixed together using these proportions, then a resist composition can be obtained for which the measured value of the contact angle is no higher than 40 degrees.

The resist composition can be obtained, for example, by dissolving the component (A), the component (B) and any other components in an organic solvent. The plurality of copolymers may be mixed together in advance to form the component (A), and this mixed component then dissolved in the organic solvent with the other components, or the plurality of copolymers may be added to the organic solvent at the same time as the other components, thereby dissolving the components and forming the component (A) in a single step.

Each of the plurality of copolymers that are mixed together contain the same structural units.

Amongst this plurality of copolymers, although the respective proportions of the various structural units may vary, using copolymers with the same proportions of the various structural units enables more ready control of the contact angle, and is consequently preferred.

Furthermore, there are no particular restrictions on the number of copolymers that are mixed, which may be any number of 2 or greater, although the number is preferably from 2 to 4, even more preferably from 2 to 3, and is most preferably 2.

The contact angles for the plurality of copolymers that undergo mixing preferably include at least one copolymer for which the measured value of the contact angle is at least 40 degrees, and one copolymer for which the measured value of the contact angle is less than 40 degrees. The contact angle for the former copolymer is even more preferably greater than 40 degrees, even more preferably within a range from 42 to 50 degrees, and is most preferably from 42 to 46 degrees. The contact angle for the latter copolymer is even more preferably within a range from 30 to 36 degrees, and is most preferably from 30 to 34 degrees.

When measuring the contact angles for the purpose of determining the respective copolymer mixing proportions as described above, the make-up of the compositions besides the nature of the component (A) is preferably set in the manner described in the example below, and the contact angle is then measured for the thus prepared resist compositions.

If the same composition as the example is employed, the contact angles are measured, and the respective mixing proportions for the copolymers within the component (A) are determined, then if, for example, factors other than the nature of the component (A) are altered slightly, for example in order to formulate a composition that is ideal for an ArF excimer laser, the effects of the present invention can still be realized. As a result, the mixing proportions of the copolymers within the component (A) can be determined relatively easily.

As follows is a description of a preferred composition for a resist composition produced in accordance with the present invention.

Component (A)

There are no particular restrictions on the component (A), and either one, or two or more alkali-soluble resins or resins that can be converted to an alkali-soluble form can be selected and used from amongst those resins proposed as resins for chemically amplified resists. In the case of the former type of resin, the resin functions as a component for forming a so-called negative resist composition, whereas in the case of the latter type of resin, the resin functions as a component for forming a so-called positive resist composition.

In the case of a negative composition, a cross-linking agent is added to the resist composition together with the alkali-soluble resin and the component (B). During resist pattern formation, when acid is generated from the component (B) by exposure, the action of that acid causes cross-linking between the alkali-soluble resin and the cross-linking agent, converting the resin to an alkali-insoluble state.

The alkali-soluble resin is preferably a resin that contains structural units derived from at least one compound selected from amongst α-(hydroxyalkyl)acrylic acids and lower alkyl esters of α-(hydroxyalkyl)acrylic acids.

Furthermore as the cross-linking agent, usually, an amino-based cross-linking agent such as a glycoluril that contains a methylol group or alkoxymethyl group, and particularly a butoxymethyl group, is preferred.

The blend quantity of the cross-linking agent is preferably within a range from 1 to 50 parts by weight per 100 parts by weight of the alkali-soluble resin.

In the case of a positive composition, the component (A) is an alkali-insoluble resin containing so-called acid-dissociable, dissolution-inhibiting groups, and when acid is generated from the component (B) upon exposure, the action of that acid causes the acid-dissociable, dissolution-inhibiting groups to dissociate, converting the component (A) to an alkali-soluble state.

As a result, during resist pattern formation, if the resist composition applied to the surface of a substrate is selectively exposed, then the exposed portions develop increased alkali solubility and can subsequently be subjected to alkali developing.

For both positive and negative compositions, the component (A) preferably contains structural units derived from (α-lower alkyl)acrylate esters.

In the present invention, a positive composition is preferred. Moreover, as the plurality of copolymers that constitute the component (A), the use of copolymers (A1') containing a structural unit (a1') derived from an (α-lower alkyl) acrylate that contains an acid dissociable, dissolution inhibiting group, and a structural unit (a2') derived from an (α-lower alkyl)acrylate that contains a lactone ring is preferred.

Structural Unit (a1')

In the structural unit (a1'), a hydrogen atom or a lower alkyl group is bonded to the α-carbon atom, although a hydrogen atom is preferred. Hereafter, a unit in which a hydrogen atom is bonded to the α-carbon atom is referred to as a structural unit (a1).

The lower alkyl group is preferably a straight-chain or branched alkyl group of 1 to 5 carbon atoms, and specific examples include a methyl group, ethyl group, propyl group, isopropyl group, n-butyl group, isobutyl group, tert-butyl group, pentyl group, isopentyl group, and neopentyl group. Of these, a methyl group is preferred industrially.

The acid dissociable, dissolution inhibiting group of the structural unit (a1') is a group that exhibits an alkali dissolution inhibiting effect that renders the entire component (A1') alkali-insoluble prior to exposure, but then dissociates under the action of acid generated from the acid generator (B) following exposure, causing the entire component (A1') to change to an alkali-soluble state.

The acid dissociable, dissolution inhibiting group can be selected appropriately from the multitude of such groups proposed for use within resins for resist compositions used with an ArF excimer laser. Typically, groups that form either a cyclic or chain-like tertiary alkyl ester, or a cyclic or chain-like alkoxyalkyl ester with the carboxyl group of acrylic acid are the most widely known.

A cyclic or chain-like alkoxyalkyl ester refers to a structure in which the hydrogen atom of a carboxyl group has been substituted with an alkoxyalkyl group to form an ester, so that the alkoxyalkyl group is bonded to the terminal oxygen atom of the carbonyloxy group (—C(O)—O—), and when an acid acts on this alkoxyalkyl ester, the bond between the oxygen atom and the alkoxyalkyl group is broken. Examples of these types of cyclic or chain-like alkoxyalkyl groups include a 1-methoxymethyl group, 1-ethoxyethyl group, 1-isopropoxyethyl group, 1-cyclohexyloxyethyl group, 2-adamantoxymethyl group, 1-methyladamantoxymethyl group, and 4-oxo-2-adamantoxymethyl group.

Examples of acid dissociable, dissolution inhibiting groups that form a chain-like tertiary alkyl ester include a t-butyl group or tert-amyl group.

As the structural unit (a1'), structural units that include an acid dissociable, dissolution inhibiting group that contains a cyclic group, and particularly an alicyclic group, are preferred. The alicyclic group may be either a monocyclic or a polycyclic group, and can be selected appropriately from the multitude of such groups proposed for use within ArF resists, although from the viewpoint of etching resistance, a polycyclic alicyclic group is preferred. Furthermore, the alicyclic group is preferably a hydrocarbon group, and is preferably saturated.

Examples of suitable monocyclic alicyclic groups include groups in which one hydrogen atom has been removed from a cycloalkane. Examples of suitable polycyclic alicyclic groups include groups in which one hydrogen atom has been removed from a bicycloalkane, tricycloalkane or tetracycloalkane or the like.

Specifically, examples of suitable monocyclic alicyclic groups include a cyclopentyl group or cyclohexyl group. Examples of suitable polycyclic alicyclic groups include groups in which one hydrogen atom has been removed from a polycycloalkane such as adamantane, norbornane, isobornane, tricyclodecane or tetracyclododecane.

Of these groups, an adamantyl group in which one hydrogen atom has been removed from adamantane, a norbornyl group in which one hydrogen atom has been removed from norbornane, a tricyclodecanyl group in which one hydrogen atom has been removed from tricyclodecane, and a tetracyclododecanyl group in which one hydrogen atom has been removed from tetracyclododecane are preferred industrially.

More specifically, the structural unit (a1') is preferably at least one unit selected from the general formulas (I') to (III') shown below.

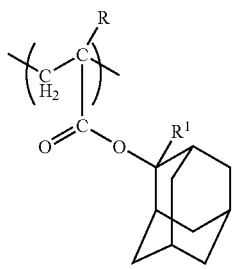
(I')

[In the formula (I'), R represents a hydrogen atom or a lower alkyl group, and $R^1$ represents a lower alkyl group.]

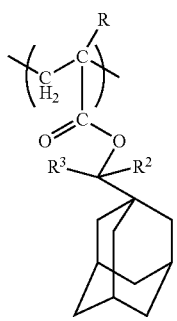
(II')

[In the formula (II'), R represents a hydrogen atom or a lower alkyl group, and $R^2$ and $R^3$ each represent, independently, a lower alkyl group.]

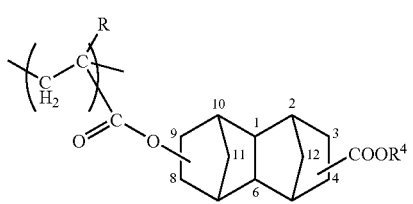
(III')

[In the formula (III), R represents a hydrogen atom or a lower alkyl group, and $R^4$ represents a tertiary alkyl group.]

The group R is as described above in relation to the hydrogen atom or lower alkyl group bonded to the α-carbon atom.

The group $R^1$ is preferably a straight-chain or branched lower alkyl group of 1 to 5 carbon atoms, and specific examples include a methyl group, ethyl group, propyl group, isopropyl group, n-butyl group, isobutyl group, pentyl group, isopentyl group, and neopentyl group. Of these, a methyl group or ethyl group is preferred from the viewpoint of industrial availability.

The groups $R^2$ and $R^3$ each preferably represent, independently, a straight-chain or branched lower alkyl group of 1 to 5 carbon atoms. Of these groups, those cases in which $R^2$ and $R^3$ are both methyl groups are preferred industrially, and a structural unit derived from 2-(1-adamantyl)-2-propyl acrylate is a specific example.

Furthermore, the group $R^4$ is preferably a chain-like tertiary alkyl group or a cyclic tertiary alkyl group. Examples of chain-like tertiary alkyl groups include a tert-butyl group or tert-amyl group, although those cases in which $R^4$ is a tert-butyl group are preferred industrially. A tertiary alkyl group refers to an alkyl group that includes a tertiary carbon atom.

Examples of cyclic tertiary alkyl groups include the same groups as those exemplified above in relation to the "acid dissociable, dissolution inhibiting group that contains an alicyclic group", and specific examples include a 2-methyl-2-adamantyl group, 2-ethyl-2-adamantyl group, 2-(1-adamantyl)-2-propyl group, 1-ethylcyclohexyl group, 1-ethylcyclopentyl group, 1-methylcyclohexyl group or 1-methylcyclopentyl group.

Furthermore, the group —$COOR^4$ may be bonded to either position 3 or 4 of the tetracyclododecanyl group shown in the formula, although the bonding position cannot be further specified. Furthermore, the carboxyl group residue of the acrylate structural unit may be bonded to either position 8 or 9 within the formula, although similarly, the bonding position cannot be further specified.

The structural unit (a1') may use either a single structural unit, or a combination of two or more different structural units.

The proportion of the structural unit (a1'), relative to the combined total of all the structural units within the component (A1'), is typically within a range from 20 to 60 mol %, and is preferably from 30 to 50 mol %, and most preferably from 35 to 45 mol %. By ensuring that this proportion is at least as large as the lower limit of the above range, a favorable pattern can be obtained, whereas ensuring that the proportion is no greater than the upper limit of the above range enables a favorable balance to be achieved with the other structural units.

Structural Unit (a2')

In the structural unit (a2'), a lower alkyl group or a hydrogen atom is bonded to the α-carbon atom, although a lower alkyl group is preferred, and a methyl group is the most desirable. Hereafter, a unit in which a lower alkyl group is bonded to the α-carbon atom is referred to as a structural unit (a2).

Examples of the structural unit (a2') include structural units in which a monocyclic group formed from a lactone ring or a polycyclic group that includes a lactone ring is bonded to the ester side-chain portion of an α-lower alkyl acrylate. The term lactone ring refers to a single ring containing a —O—C(O)— structure, and this ring is counted as the first ring. Accordingly, in this description, the case in which the only ring structure is the lactone ring is referred to as a monocyclic group, and groups containing other ring structures are described as polycyclic groups regardless of the structure of the other rings.

Specific examples of the structural unit (a2') include units that contain a monocyclic group in which one hydrogen atom has been removed from γ-butyrolactone, and units that contain a polycyclic group in which one hydrogen atom has been removed from a lactone ring-containing bicycloalkane.

In the structural unit (a2'), the lower alkyl group bonded to the α-carbon atom is as described above for the structural unit (a1'), and a methyl group is preferred.

Specifically, the structural unit (a2') is preferably at least one unit selected from general formulas (IV') through (VII') shown below.

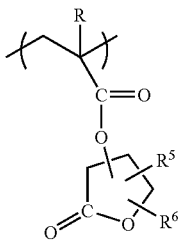
(IV')

[In the formula (IV'), R represents a hydrogen atom or a lower alkyl group, and $R^5$ and $R^6$ each represent, independently, a hydrogen atom or a lower alkyl group.]

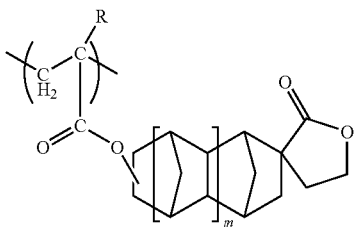
(V')

[In the formula (V'), R represents a hydrogen atom or a lower alkyl group, and m represents either 0 or 1.]

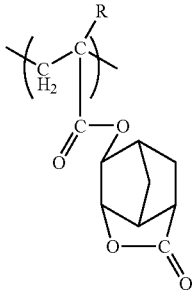
(VI')

[In the formula (VI'), R represents a hydrogen atom or a lower alkyl group.]

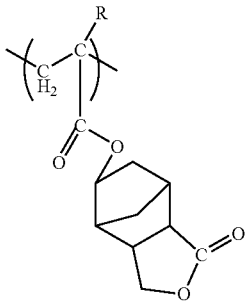
(VII')

[In the formula (VII'), R represents a hydrogen atom or a lower alkyl group.]

In the formulas (IV') to (VII'), R is as described above.

In the formula (IV'), $R^5$ and $R^6$ each represent, independently, a hydrogen atom or a lower alkyl group, and preferably a hydrogen atom. Suitable lower alkyl groups for the groups $R^5$ and $R^6$ are preferably straight-chain or branched alkyl groups of 1 to 5 carbon atoms, and specific examples include a methyl group, ethyl group, propyl group, isopropyl group, n-butyl group, isobutyl group, tert-butyl group, pentyl group, isopentyl group, and neopentyl group. A methyl group is preferred industrially.

Furthermore, amongst the structural units represented by the general formulas (IV') through (VII'), structural units represented by the general formula (IV') are preferred in terms of reducing defects, and of the possible structural units represented by the formula (IV'), α-methacryloyloxy-γ-butyrolactone, in which R is a methyl group, $R^5$ and $R^6$ are both hydrogen atoms, and the position of the ester linkage between the methacrylate ester and the γ-butyrolactone is at the α-position of the lactone ring, is the most desirable.

The structural unit (a2') may use either a single structural unit, or a combination of two or more different structural units.

The proportion of the structural unit (a2'), relative to the combined total of all the structural units within the component (A1'), is typically within a range from 20 to 60 mol %, and is preferably from 20 to 50 mol %, and most preferably from 30 to 45 mol %. Ensuring that this proportion is at least as large as the lower limit of the above range improves the lithography characteristics, whereas ensuring that the proportion is no greater than the upper limit of the above range enables a favorable balance to be achieved with the other structural units.

In the present invention, the component (A1') is preferably a copolymer that also includes a structural unit (a3') derived from an (α-lower alkyl)acrylate ester that contains a polar group-containing polycyclic group.

Structural Unit (a3')

Including the structural unit (a3') increases the hydrophilicity of the entire component (A1'), thereby improving the affinity with the developing solution, improving the alkali solubility within the exposed portions of the resist, and contributing to an improvement in the resolution.

In the structural unit (a3'), either a lower alkyl group or a hydrogen atom may be bonded to the α-carbon atom, although a hydrogen atom is preferred. Details of suitable lower alkyl groups are as described above.

Examples of the polar group include a hydroxyl group, cyano group, carboxyl group, or amino group or the like, although a hydroxyl group is particularly preferred.

Examples of the polycyclic group include polycyclic alicyclic hydrocarbon groups (polycyclic groups). This polycyclic group can be selected appropriately from the same multitude of polycyclic groups exemplified above in relation to the structural unit (a1').

Specifically, the structural unit (a3') is preferably at least one unit selected from the general formulas (VIII') through (IX') shown below.

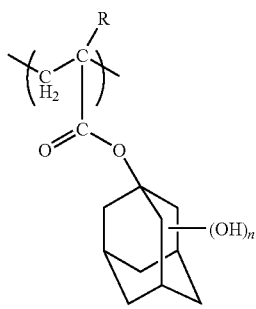

[In the formula (VIII'), R represents a hydrogen atom or a lower alkyl group, and n represents an integer from 1 to 3.]

In the formula (VIII'), R is as described above.

Of these units, structural units in which n is 1, and the hydroxyl group is bonded to position 3 of the adamantyl group are preferred.

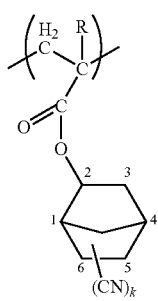

[In the formula (IX'), R represents a hydrogen atom or a lower alkyl group, and k represents an integer from 1 to 3.]

In the formula (IX'), R is as described above, and is preferably a hydrogen atom.

Of these units, structural units in which k is 1 are preferred. Furthermore, the cyano group is preferably bonded to position 5 or position 6 of the norbornyl group.

The structural unit (a3') may use either a single structural unit, or a combination of two or more different structural units.

The proportion of the structural unit (a3'), relative to the combined total of all the structural units that constitute the component (A'), is typically within a range from 10 to 50 mol %, and is preferably from 15 to 40 mol %, and most preferably from 20 to 35 mol %.

Ensuring that this proportion is at least as large as the lower limit of the above range improves the lithography characteristics, whereas ensuring that the proportion is no greater than the upper limit of the above range enables a favorable balance to be achieved with the other structural units.

Other Structural Units

The component (A1') may include structural units other than the aforementioned structural units (a1') through (a3'), but the combined total of these structural units (a1') through (a3'), relative to the combined total of all the structural units, is typically at least 70 mol %, and is preferably 80 mol % or greater, and most preferably 100 mol %.

A structural unit (a4) besides the structural units (a1') through (a3') may be any other structural unit that cannot be classified as one of the above structural units (a1') through (a3'), and there are no particular restrictions.

As the other structural unit (a4), structural units that, for example, contain a polycyclic alicyclic hydrocarbon group and are derived from an (α-lower alkyl)acrylate are preferred. Examples of the polycyclic alicyclic hydrocarbon group include, for example, the same multitude of groups listed above in relation to the structural unit (a1'), and of these, in terms of industrial availability and the like, one or more groups selected from amongst a tricyclodecanyl group, adamantyl group, tetracyclododecanyl group, norbornyl group, and isobornyl group is preferred.

Specific examples of the structural unit (a4) include units of the structures (X) to (XII) shown below.

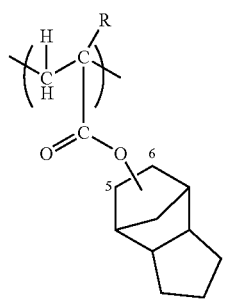

(wherein, R represents a hydrogen atom or a lower alkyl group)

This structural unit typically exists as a mixture of the isomers in which the bonding position is either position 5 or position 6.

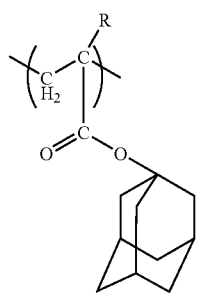

(wherein, R represents a hydrogen atom or a lower alkyl group)

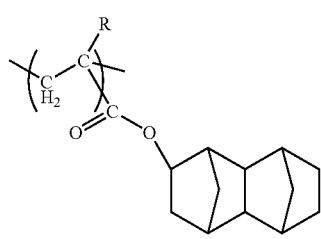

(wherein, R represents a hydrogen atom or a lower alkyl group)

In those cases where a structural unit (a4) is included, the proportion of the structural unit (a4) within the component (A1'), relative to the combined total of all the structural units, is typically within a range from 1 to 25 mol %, and is preferably from 5 to 20 mol %.

Furthermore, the component (A1') is preferably a copolymer that includes at least the structural units represented by the chemical formulas shown below, and is even more preferably a copolymer formed solely from these structural units.

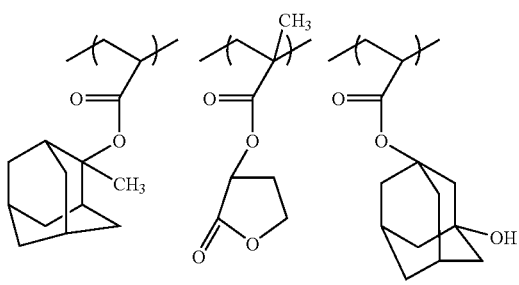

The component (A1') may include either a single resin, or a mixture of two or more different resins.

Furthermore, the component (A1') can be obtained, for example, by a conventional radical polymerization or the like of the monomers corresponding with each of the structural units, using a radical polymerization initiator such as azobisisobutyronitrile (AIBN).

Although there are no particular restrictions on the weight average molecular weight (the polystyrene equivalent weight average molecular weight determined by gel permeation chromatography, this also applies below) of the component (A1'), the value is typically no more than 30,000, and is preferably no more than 20,000, even more preferably 12,000 or lower, and is most preferably 10,000 or lower.

There are no particular restrictions on the lower limit of the weight average molecular weight of the component (A1'), although from the viewpoints of inhibiting pattern collapse and achieving a favorable improvement in resolution and the like, the weight average molecular weight is preferably at least 4,000, and even more preferably 5,000 or greater.

Component (B)

The component (B) can use any of the known acid generators used in conventional chemically amplified resist compositions without any particular restrictions.

Examples of the types of acid generators that have been used are numerous, and include onium salt-based acid generators such as iodonium salts and sulfonium salts, oxime sulfonate-based acid generators, diazomethane-based acid generators such as bisalkyl or bisaryl sulfonyl diazomethanes, and poly(bis-sulfonyl)diazomethanes, iminosulfonate-based acid generators, and disulfone-based acid generators.

Specific examples of suitable onium salt-based acid generators include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, and tri(4-tert-butyl)phenylsulfonium trifluoromethanesulfonate, heptafluoropropanesulfonate or nonafluorobutanesulfonate.

Specific examples of suitable oxime sulfonate-based acid generators include α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile. of these, α-(methylsulfonyloxyimino)-p-methoxyphenyl acetonitrile is preferred.

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include the structures shown below, such as 1,3-bis(phenylsulfonyldiazomethylsulfonyl)propane (compound A), 1,4-bis(phenylsulfonyldiazomethylsulfonyl)butane (compound B), 1,6-bis(phenylsulfonyldiazomethylsulfonyl)hexane (compound C), 1,10-bis(phenylsulfonyldiazomethylsulfonyl)decane (compound D), 1,2-bis(cyclohexylsulfonyldiazomethylsulfonyl)ethane (compound E), 1,3-bis(cyclohexylsulfonyldiazomethylsulfonyl)propane (compound F), 1,6-bis(cyclohexylsulfonyldiazomethylsulfonyl)hexane (compound G), and 1,10-bis(cyclohexylsulfonyldiazomethylsulfonyl)decane (compound H).

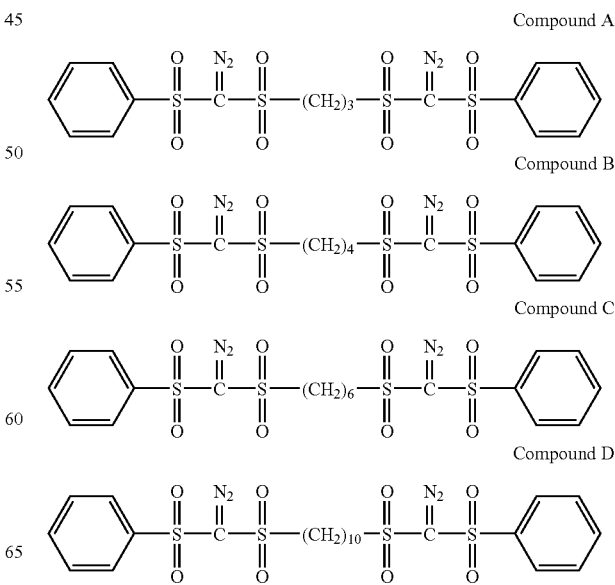

-continued

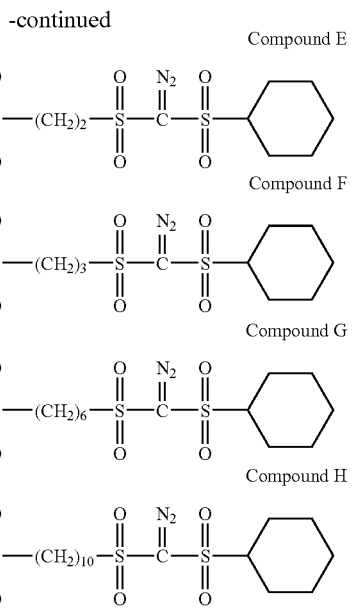

Compound E

Compound F

Compound G

Compound H

In the present invention, of the above possibilities, the component (B) preferably uses an onium salt with a fluorinated alkylsulfonate ion as the anion.

Furthermore, as the component (B), the use of at least one sulfonium compound selected from the group consisting of structural units represented by general formulas (b-1) and (b-2) shown below is also preferred.

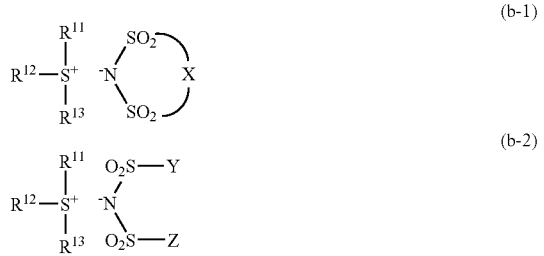

[In these formulas, X represents an alkylene group of 2 to 6 carbon atoms in which at least one hydrogen atom has been substituted with a fluorine atom; Y and Z each represent, independently, an alkyl group of 1 to 10 carbon atoms in which at least one hydrogen atom has been substituted with a fluorine atom; and $R^{11}$ to $R^{13}$ each represent, independently, an aryl group or an alkyl group, although at least one of the groups $R^{11}$ to $R^{13}$ is an aryl group.]

In the formulas (b-1) and (b-2), the group X is a straight-chain or branched alkylene group in which at least one hydrogen atom has been substituted with a fluorine atom, and the number of carbon atoms within the alkylene group is typically within a range from 2 to 6, preferably from 3 to 5, and is most preferably 3.

Y and Z each represent, independently, a straight-chain or branched alkyl group in which at least one hydrogen atom has been substituted with a fluorine atom, and the number of carbon atoms within the alkyl group is typically within a range from 1 to 10, preferably from 1 to 7, and is most preferably from 1 to 3.

Lower numbers of carbon atoms within the alkylene group X or the alkyl groups Y and Z result in better solubility within the resist solvent, and are consequently preferred.

Furthermore, in the alkylene group X or the alkyl groups Y and Z, the larger the number of hydrogen atoms that have been substituted with fluorine atoms, the stronger the acid becomes, and the transparency relative to high energy light beams of 200 nm or less or electron beams also improves favorably. The fluorine atom proportion within the alkylene group or alkyl groups, namely the fluorination ratio, is preferably within a range from 70 to 100%, and even more preferably from 90 to 100%, and perfluoroalkylene or perfluoroalkyl groups in which all of the hydrogen atoms have been substituted with fluorine atoms are the most desirable.

$R^{11}$ to $R^{13}$ each represent, independently, an aryl group or an alkyl group.

Of the groups $R^{11}$ to $R^{13}$, at least one group represents an aryl group. Compounds in which at least two of $R^{11}$ to $R^{13}$ represent aryl groups are preferred, and compounds in which all of $R^{11}$ to $R^{13}$ are aryl groups are the most preferred.

There are no particular restrictions on the aryl groups of $R^{11}$ to $R^{13}$, and suitable examples include aryl groups of 6 to 20 carbon atoms, such as phenyl groups and naphthyl groups, which may, or may not, be substituted with alkyl groups, halogen atoms, and/or alkoxy groups and the like. In terms of enabling low cost synthesis, aryl groups of 6 to 10 carbon atoms are preferred.

There are no particular restrictions on the alkyl groups of $R^{11}$ to $R^{13}$, and suitable examples include straight-chain, branched, or cyclic alkyl groups of 1 to 10 carbon atoms. From the viewpoint of achieving excellent resolution, alkyl groups of 1 to 5 carbon atoms are preferred. Specific examples include a methyl group, ethyl group, n-propyl group, isopropyl group, n-butyl group, isobutyl group, n-pentyl group, cyclopentyl group, hexyl group, cyclohexyl group, nonyl group, and decanyl group, although in terms of achieving superior resolution and enabling low cost synthesis, a methyl group is the most desirable.

Of the above possibilities, compounds in which $R^{11}$ to $R^{13}$ are all phenyl groups are the most preferred.

These sulfonium compounds can be used either alone, or in combinations of two or more different compounds.

The component (B) may use either a single acid generator, or a combination of two or more different acid generators.

The quantity used of the component (B) is typically within a range from 0.5 to 30 parts by weight, and preferably from 1 to 10 parts by weight, per 100 parts by weight of the component (A). At quantities less than the above range, there is a danger that pattern formation may not proceed satisfactorily, whereas if the quantity exceeds the above range, achieving a uniform solution becomes difficult, and there is a danger of a deterioration in the storage stability.

In a resist composition of the present invention, in order to improve the resist pattern shape and the post exposure stability of the latent image formed by the pattern-wise exposure of the resist layer, a nitrogen-containing organic compound (D) (hereafter referred to as the component (D)) may also be added as an optional component.

Nitrogen-Containing Organic Compound (D)

A multitude of these components (D) have already been proposed, and any of these known compounds can be used, although an amine, and particularly a secondary lower aliphatic amine or tertiary lower aliphatic amine is preferred.

Here, a lower aliphatic amine refers to an alkyl or alkyl alcohol amine of no more than 5 carbon atoms, and examples of these secondary and tertiary amines include trimethylamine, diethylamine, triethylamine, di-n-propylamine, tri-n-propylamine, tripentylamine, diethanolamine, triethanolamine and triisopropanolamine, and of these, tertiary alkanolamines such as triethanolamine and triisopropanolamine are particularly preferred.

These compounds may be used either alone, or in combinations of two or more different compounds.

The component (D) is typically used in a quantity within a range from 0.01 to 5.0 parts by weight per 100 parts by weight of the component (A).

Furthermore, in order to prevent any deterioration in sensitivity caused by the addition of the aforementioned component (D), and improve the resist pattern shape and the post exposure stability of the latent image formed by the patternwise exposure of the resist layer, an organic carboxylic acid, or a phosphorus oxo acid or derivative thereof can also be added as another optional component (E) (hereafter referred to as the component (E)). The component (D) and the component (E) can be used in combination, or either one can also be used alone.

Component (E)

For the component (E), examples of suitable organic carboxylic acids include malonic acid, citric acid, malic acid, succinic acid, benzoic acid, and salicylic acid.

For the component (E), examples of suitable phosphorus oxo acids or derivatives thereof include phosphoric acid or derivatives thereof such as esters, including phosphoric acid, di-n-butyl phosphate, and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

Organic Solvent

A resist composition can be produced by dissolving the materials in an organic solvent.

The organic solvent may be any solvent capable of dissolving the various components to generate a uniform solution, and one or more solvents selected from known materials used as the solvents for conventional chemically amplified resists can be used.

Specific examples of the solvent include ketones such as γ-butyrolactone, acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol mono acetate, dipropylene glycol, or the monomethyl ether, mono ethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents can be used either alone, or as a mixed solvent of two or more different solvents.

Furthermore, mixed solvents of propylene glycol monomethyl ether acetate (PGMEA) and a polar solvent are preferred. Although the blend ratio (weight ratio) in such mixed solvents can be set in accordance with factors such as the co-solubility of the PGMEA and the polar solvent, the ratio is preferably within a range from 1:9 to 9:1, and even more preferably from 2:8 to 8:2.

More specifically, in those cases where EL is added as the polar solvent, the weight ratio PGMEA:EL is preferably within a range from 2:8 to 8:2, and even more preferably from 3:7 to 7:3.

Furthermore, as the organic solvent, mixed solvents containing at least one of PGMEA and EL, together with γ-butyrolactone, are also preferred. In such cases, the weight ratio of the former and latter components in the mixed solvent is preferably within a range from 70:30 to 95:5.

There are no particular restrictions on the quantity used of the organic solvent, although the quantity should provide a concentration that enables favorable application of the solution to a substrate or the like, should be set in accordance with the required coating film thickness, and is typically set so that the solid fraction concentration within the resist composition falls within a range from 2 to 20% by weight, and even more preferably from 5 to 15% by weight.

Other Optional Components

Other miscible additives can also be added to a positive resist composition of the present invention according to need, and examples include additive resins for improving the properties of the resist film, surfactants for improving the ease of application, dissolution inhibitors, plasticizers, stabilizers, colorants, halation prevention agents, and dyes.

The measured value for the contact angle of the resist composition can be adjusted using the methods described below.

(Method 1)

If a copolymer is used in which the structural unit (a1) is used as the structural unit (a1') and the structural unit (a2) is used as the structural unit (a2'), then the value of the contact angle can easily be adjusted to a value within the desired range of 40 degrees or lower.

Accordingly, the use of a copolymer containing a structural unit (a1) and a structural unit (a2) is preferred. A copolymer that further contains a structural unit (a3') is also preferred.

Using this method enhances the ability of the resist composition to yield the required lithography characteristics. Moreover, the sensitivity also improves.

Furthermore, the required lithography characteristics can also be obtained using a shrink process described below.

Moreover, in the shrink process, narrowing can be achieved even if the temperature during the shrink step is lower than that used in conventional processes, which is preferred in terms of the apparatus and handling.

(Method 2)

The contact angle can be altered by adjusting the nature and blend quantities of the structural units of the copolymer (A1'), or by adjusting the nature and blend quantities of the other components such as the component (B). For example, suitable methods include: increasing the blend quantities of structural units with hydrophilic regions, such as the structural unit (a2') and the structural unit (a3'); selecting an acid generator that contains a hydrophilic group as the component (B); and adding a compound that contains a hydrophilic group as an additive.

By using a production method of the present invention, a resist composition is obtained that enables a reduction in the level of defects to be achieved.

The reason that adjustment of the contact angle enables a reduction in defects to be achieved is not entirely clear, but the following reasoning is thought likely.

Namely, a resist pattern is obtained by applying the resist composition to a substrate, conducting a prebake, performing selective exposure, and then conducting PEB (post exposure baking) and performing alkali developing, but in the alkali developing step, following dissolution and removal of the exposed portions of the resist using the alkali developing solution, any residual developing solution and the like is usually removed by rinsing with pure water.

During this rinse, because the resist composition with an adjusted contact angle generates a resist film that exhibits a small contact angle at the resist surface, meaning the surface is readily wet (has a high level of hydrophilicity), it is thought that the affinity with comparatively hydrophobic solid components that can cause defects (including those components that re-precipitate during rinsing), such as deposits that contain resin components and residual substances that are left undissolved by the developing solution, is reduced, meaning these deposits and residual substances can be readily removed from the resist film surface during the alkali developing and rinsing steps, thereby leading to a reduction in the level of defects.

[Resist Composition]

A resist composition of the present invention is a resist composition produced using the method for producing a resist composition according to the present invention.

A resist composition of the present invention is prepared so that the contact angle enables a reduction in the level of defects, and as a result, yields an effect that enables the level of defects to be reduced.

A resist composition obtained using the present invention can be applied, for example, to the method for forming a resist pattern described below.

<General Method>

Namely, a positive resist composition described above is first applied to a support such as a silicon wafer using a spinner or the like, a prebake is then conducted under temperature conditions of 80 to 150° C., for a period of 40 to 120 seconds, and preferably for 60 to 90 seconds, and following selective exposure (irradiation) of the thus obtained film with an ArF exposure apparatus or the like, by irradiating ArF excimer laser light through a desired mask pattern, PEB (post exposure baking) is conducted under temperature conditions of 80 to 150° C., for a period of 40 to 120 seconds, and preferably for 60 to 90 seconds. Subsequently, a developing treatment is conducted using an alkali developing solution such as a 0.1 to 10% by weight aqueous solution of tetramethylammonium hydroxide. In this manner, a resist pattern that is faithful to the mask pattern can be obtained.

An organic or inorganic anti-reflective film may also be provided between the support (substrate) and the applied layer of the resist composition.

As the support, conventional materials can be used without any particular restrictions, and suitable examples include substrates for electronic componentry, as well as substrates on which a predetermined wiring pattern has already been formed.

Specific examples of suitable substrates include silicon wafers, metal-based substrates such as copper, chrome, iron, and aluminum, as well as glass substrates.

Suitable materials for the wiring pattern include copper, solder, chrome, aluminum, nickel, and gold.

There are no particular restrictions on the wavelength used for the exposure (irradiation), and an ArF excimer laser, KrF excimer laser, $F_2$ excimer laser, or other radiation such as EUV (extreme ultraviolet), VUV (vacuum ultraviolet), EB (electron beam), X-ray or soft X-ray radiation can be used. A resist composition according to the present invention is particularly effective for use with an ArF excimer laser.

<Application to Shrink Process>

A positive resist composition of the present invention can be used favorably within a shrink process detailed below. In other words, even when applied to a shrink process, the composition is able to yield favorable lithography characteristics.

The applicants of the present invention have previously proposed a shrink process that includes the steps of forming a resist pattern on top of a support, forming a water-soluble coating on top of the resist pattern, and then shrinking this water-soluble coating by heat treatment and using the heat shrinkage effect to narrow the resist pattern size (see Japanese Unexamined Patent Application, First Publication No. 2003-107752 and Japanese Unexamined Patent Application, First Publication No. 2003-202679).

The shrink process is a method in which, following the covering of a resist pattern with a water-soluble coating, this water-soluble coating is shrunk by heat treatment, and this heat shrinkage action is used to narrow the spacing of the resist pattern.

A method for forming a resist pattern that includes the conducting of a shrink process can be conducted, for example, in the manner described below.

First, a resist pattern is formed using the general method described above.

Subsequently, following developing of the resist pattern, a shrink process is conducted to narrow the resist pattern size.

In the shrink process, first, a water-soluble coating formation agent containing a water-soluble polymer or the like is applied to the surface of the resist pattern formed on the support, preferably forming a laminate in which the water-soluble coating covers the entire surface of the resist pattern.

Following application of the water-soluble coating formation agent, the support may be subjected to a prebake at a temperature of 80 to 100° C. for a period of 30 to 90 seconds.

The application step can be conducted in accordance with known methods used in the formation of conventional resist layers (resist films) and the like. In other words, an aqueous solution of the coating formation agent can be applied to the resist pattern using a spinner or the like.

The thickness of the water-soluble coating is preferably either similar to the height of the photoresist pattern, or of a height sufficient to cover the pattern, and is typically within a range from approximately 0.1 to 0.5 μm.

Subsequently, the thus obtained laminate is subjected to heat treatment, causing the water-soluble coating to undergo heat shrinkage. As a result of this heat shrinkage action on the water-soluble coating, the side walls of the resist pattern that contact the water-soluble coating are pulled together, thereby narrowing the spacing (between patterns) of the resist-free portions within the resist pattern. As a result, the pattern can be reduced in size.

In the shrink process, the heat treatment is conducted at a temperature that is sufficient to cause shrinkage of the water-soluble coating, and is conducted at a heating temperature and for a heating period that does not cause fluidization of the resist.

The heating temperature is preferably set to a value that is from 3 to 50° C. lower, and even more preferably approximately 5 to 30° C. lower, than the temperature (the fluidization temperature) at which heat treatment starts to causes spontaneous flow of the resist pattern formed on the support. Moreover, if the shrinking performance of the water-soluble coating is also taken into consideration, then a preferred heat treatment is typically conducted within a temperature range from 80 to 160° C., and preferably from 130 to 160° C. In the resist composition of the second aspect, the pattern is able to be narrowed even when the heating temperature is set to a comparatively low temperature. Favorable temperature conditions are typically within a range from 70 to 150° C.

The fluidization temperature of a resist pattern varies depending on the nature and blend quantities of the components contained within the resist composition.

The heating time varies depending on the heating temperature, but is typically within a range from 30 to 90 seconds.

Subsequently, the water-soluble coating remaining on the pattern is removed by washing with an aqueous solvent, and preferably with pure water, for 10 to 60 seconds.

The water-soluble coating is easily removed by washing with water, and is able to be completely removed from the support and the resist pattern.

As follows is a description of a water-soluble coating formation agent that is suitable for the above shrink process.

The water-soluble coating formation agent contains a water-soluble polymer.

A water-soluble coating formation agent containing this type of water-soluble polymer is ideal for use within the shrink process.

From an industrial viewpoint, the water-soluble polymer used is preferably selected from amongst acrylic-based polymers, vinyl-based polymers, cellulose-based derivatives, alkylene glycol-based polymers, urea-based polymers, melamine-based polymers, epoxy-based polymers and amide-based polymers.

Acrylic-based polymers refer to polymers that contain an acrylic-based monomer, vinyl-based polymers refer to polymers that contain a vinyl-based monomer, cellulose-based polymers refer to polymers that contain a cellulose-based monomer, alkylene glycol-based polymers refer to polymers that contain an alkylene glycol-based monomer, urea-based polymers refer to polymers that contain a urea-based monomer, melamine-based polymers refer to polymers that contain a melamine-based monomer, epoxy-based polymers refer to polymers that contain an epoxy-based monomer, and amide-based polymers refer to polymers that contain an amide-based monomer.

These polymers can be used either alone, or in mixtures of two or more different polymers.

Specific examples of suitable acrylic-based polymers include polymers or copolymers containing structural units derived from monomers such as acrylic acid, acrylamide, methyl acrylate, methacrylic acid, methyl methacrylate, N,N-dimethylacrylamide, N,N-dimethylaminopropylmethacrylamide, N,N-dimethylaminopropylacrylamide, N-methylacrylamide, diacetone acrylamide, N,N-dimethylaminoethyl methacrylate, N,N-diethylaminoethyl methacrylate, N,N-dimethylaminoethyl acrylate, and acryloyl morpholine.

Specific examples of suitable vinyl-based polymers include polymers or copolymers containing structural units derived from monomers such as morpholine, N-vinylpyrrolidone, vinylimidazolidinone, and vinyl acetate.

Specific examples of suitable cellulose-based derivatives include hydroxypropyl methylcellulose phthalate, hydroxypropyl methylcellulose acetate phthalate, hydroxypropyl methylcellulose hexahydrophthalate, hydroxypropyl methylcellulose acetate succinate, hydroxypropyl methylcellulose, hydroxypropyl cellulose, hydroxyethyl cellulose, cellulose acetate hexahydrophthalate, carboxymethylcellulose, ethylcellulose, and methylcellulose.

Specific examples of suitable alkylene glycol-based polymers include addition polymers or addition copolymers of monomers such as ethylene glycol or propylene glycol.

Specific examples of suitable urea-based polymers include polymers containing structural units derived from monomers such as methylolated urea, dimethylolated urea, and ethylene urea.

Specific examples of suitable melamine-based polymers include polymers containing structural units derived from monomers such as methoxymethylated melamine, methoxymethylated isobutoxymethylated melamine, and methoxyethylated melamine.

In addition, water-soluble epoxy-based polymers and nylon-based polymers and the like can also be used.

Of the above water-soluble polymers, those containing at least one polymer selected from a group consisting of alkylene glycol-based polymers, cellulose-based polymers, vinyl-based polymers and acrylic-based polymers is preferred, and acrylic-based polymers are the most preferred as they also offer simple pH adjustment. In addition, using a copolymer of an acrylic-based monomer and another non-acrylic monomer is preferred, as such copolymers enable efficient narrowing of the photoresist pattern size, while maintaining the shape of the photoresist pattern during the heat treatment.

Water-soluble polymers that include N-vinylpyrrolidone as a proton donor monomer and acrylic acid as a proton acceptor monomer are particularly preferred as they exhibit a particularly large shrinkage ratio on heating. In other words, the water-soluble polymer preferably contains structural units derived from acrylic acid and structural units derived from vinylpyrrolidone.

In those cases where a copolymer is used as the water-soluble polymer, there are no particular restrictions on the relative blend proportions of the structural components, although in the case of a mixture, if long term stability is considered particularly important, then the blend proportion of the acrylic-based polymer is preferably greater than that of the other structural polymers. In order to improve the long term stability, besides increasing the proportion of the acrylic-based polymer as described above, an acidic compound such as p-toluenesulfonic acid or dodecylbenzenesulfonic acid can also be added.

The water-soluble coating formation agent preferably also contains a surfactant. By using a surfactant, the occurrence of defects can be effectively prevented.

Furthermore, from the viewpoints of preventing impurities and enabling favorable pH adjustment, the water-soluble coating formation agent may also contain an optional water-soluble amine.

Moreover, from the viewpoints of reducing the photoresist pattern size and suppressing the occurrence of defects, an additional non-amine-based water-soluble organic solvent may also be added to the water-soluble coating formation agent if desired.

The water-soluble coating formation agent is preferably used in the form of a solution within either water or a water-alcohol-based solvent (in which the alcohol concentration is no higher than approximately 30% by weight relative to the water), with a concentration of 3 to 50% by weight, and even more preferably from 5 to 20% by weight.

EXAMPLES

Example

Production of Resist Compositions 1, 2, and 3

(1) The copolymer 1-1 described below was used as the component (A), and this component was mixed together with the other materials listed below, and dissolved in an organic solvent, thus yielding a resist composition with a solid fraction concentration of 8% by weight. This composition is termed the resist composition 1.

The measured value of the contact angle for the resist composition 1 (the measured value of the contact angle for the copolymer 1-1) was 44.45 degrees (44.45°).

Copolymer 1-1: 100 Parts by Weight

A copolymer formed from the structural units represented by a chemical formula (1) shown below, in which the molar ratio $l/m/n=40$ mol %/40 mol %/20 mol %, with a weight average molecular weight (Mw) of 10,000, and a polydispersity [Mw/Mn (number average molecular weight)] of 2.0.

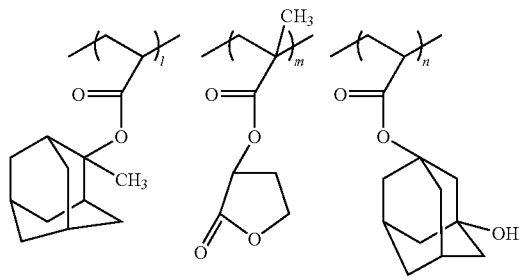

(1)

Component (B): 3.5 Parts by Weight

A compound represented by a chemical formula shown below.

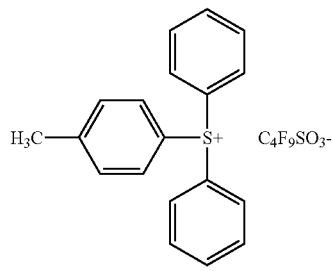

Component (D): 0.1 Parts by Weight
Triethanolamine

Organic Solvent
A mixed solvent in which PGMEA/EL=6:4 (weight ratio)

(2) Subsequently, with the exception of using a copolymer 1-2 described below instead of the copolymer 1-1, a resist composition was produced in the same manner as (1) above. This composition is termed the resist composition 2.

Copolymer 1-2: 100 Parts by Weight

A copolymer 1-2 formed from the same structural units, in the same proportions, as the copolymer 1-1, with the same weight average molecular weight and the same polydispersity, and differing from the copolymer 1-1 only in terms of the production lot.

The measured value of the contact angle for this resist composition 2 (the measured value of the contact angle for the copolymer 1-2) was 33.72 degrees (33.72°).

(3) Using the measured values of the contact angle from (1) and (2) above, the copolymer 1-1 and the copolymer 1-2 were mixed together in a mixing ratio that was calculated to yield a measured value of the contact angle for the resulting mixed resist composition that was no higher than 40 degrees.

Then, with the exception of using a component (A) produced by mixing together the copolymer 1-1 and the copolymer 1-2 in a mixing ratio of 1:1 (weight ratio) instead of the copolymer 1-1, a resist composition was produced in the same manner as (1) above. This composition was termed the resist composition 3.

The measured value of the contact angle for this resist composition 3 was 38.87 degrees (38.87°).

(Evaluation)—Evaluation of Defects

Each of the resist compositions was applied directly, using a spinner, to the surface of an 8-inch silicon wafer that had been treated with hexamethyldisilazane (HMDS), and was then prebaked (PAB) and dried on a hotplate at 105° C. for 90 seconds, thereby forming a resist film with a film thickness of 220 nm.

Subsequently, the resist film was selectively irradiated with an ArF excimer laser (193 nm) through a (binary) mask pattern, using an ArF exposure apparatus NSR-S306 (manufactured by Nikon Corporation; NA (numerical aperture)=0.78, σ=0.30).

The resist was then subjected to PEB treatment at 100° C. for 90 seconds, subsequently subjected to puddle development for 60 seconds at 23° C. in a 2.38% by weight aqueous solution of tetramethylammonium hydroxide, and a rinse liquid was then dripped onto the resist for 1 second at 1,000 rpm and then for 15 seconds at 500 rpm (enforced conditions that increase the likelihood of defect occurrence), before the resist was dried to form a resist pattern.

Furthermore, the pattern was formed as a dense hole pattern with a hole diameter of 300 nm (a pattern in which holes of diameter 300 nm were spaced at 300 nm intervals).

Subsequently, the resist was measured using a surface defect inspection device KLA2351 (a product name) manufactured by KLA Tencor Corporation, and the number of defects within the wafer was evaluated.

Depth of Focus Characteristics

An organic anti-reflective film composition "ARC-29A" (a product name, manufactured by Brewer Science Ltd.) was applied to the surface of an 8-inch silicon wafer using a spinner, and the composition was then baked and dried on a hotplate at 205° C. for 60 seconds, thereby forming an organic anti-reflective film with a film thickness of 77 nm.

The positive resist composition was then applied to the surface of this anti-reflective film using a spinner, and was then prebaked (PAB) and dried on a hotplate at 110° C. for 90 seconds, thereby forming a resist film with a film thickness of 225 nm.

Subsequently, this film was selectively irradiated with an ArF excimer laser (193 nm) through a (half-tone) mask pattern, using an ArF exposure apparatus NSR-S306 (manufactured by Nikon Corporation; NA (numerical aperture)=0.78, ⅔ annular illumination).

The resist was then subjected to PEB treatment at 100° C. for 90 seconds, subsequently subjected to puddle development for 60 seconds at 23° C. in a 2.38% by weight aqueous solution of tetramethylammonium hydroxide, and was then washed for 20 seconds with water, and dried, thus forming a resist pattern.

The pattern was formed as an isolated hole pattern with a hole diameter of 100 nm at an exposure dose of 25 mJ/cm$^2$, and the depth of focus (DOF) was then measured.

When the number of defects for the resist compositions 1, 2, and 3 were measured in accordance with the "evaluation of defects" described above, the result was 27,598 defects per 8-inch wafer for the resist composition 1.

The result for the resist composition 2 was 69 defects per 8-inch wafer. The result for the resist composition 3 was 354 defects per 8-inch wafer.

When an isolated hole pattern with a hole diameter of 100 nm was formed using each of the resist compositions 1, 2, and 3 in accordance with the "depth of focus characteristics" section described above, and the depth of focus characteristics were then measured, a result of 0.15 μm was obtained for the resist composition 1. The result for the resist composition 2 was 0.05 μm. The result for the resist composition 3 was 0.15 μm.

In this manner, the defect evaluation results for the resist compositions 2 and 3, in which the measured value of the contact angle was no higher than 40 degrees, were particularly favorable. In contrast, the defect evaluation result for the resist composition 1, in which the measured value of the contact angle exceeded 40 degrees, was poor, although the depth of focus was favorable. The depth of focus characteristics for the resist composition 2, in which the measured value of the contact angle was less than 35 degrees, were somewhat inferior, whereas the depth of focus characteristics for the resist composition 3, in which the measured value of the contact angle was 35 degrees or greater, were favorable. From these results it is evident that even if copolymers formed from the same structural units in the same proportions are used, such as the case of the resist composition 1 and the resist composition 2, the measured value of the contact angle can vary considerably depending on factors such as the production lot.

Furthermore, it is also very clear that resists for which the contact angle exceeds 40 degrees, such as the resist composition 1, exhibit particularly poor defect characteristics.

By designing the make-up of a resist composition based on measured values of the contact angle, as in the case of the resist composition 3, a resist composition can be obtained for which the measured value of the contact angle is no higher than 40 degrees, even if a copolymer is used that exhibits a large measured value for the contact angle, such as the copolymer 1-1. It is clear that designing a resist composition in this manner enables the level of defects to be reduced.

Moreover, it is also clear that by adjusting the measured value of the contact angle to a value of at least 35 degrees, such as the case of the resist composition 3, the lithography characteristics can be improved.

Comparative Examples 1 to 5

In order to further investigate the effects of the measured value of the contact angle, resist compositions of comparative examples were prepared in the manner described below, and subsequently evaluated for defects.

Comparative Example 1

With the exception of using the copolymer described below, a positive resist composition with a solid fraction concentration of 8% by weight was produced in the same manner as the example. The contact angle for a resist film formed from this resist composition, following application of a developing solution, was 51.18 degrees (51.18°).

Copolymer: 100 Parts by Weight

A copolymer formed from the structural units represented by a chemical formula (2) shown below, in which the molar ratio l'/m'/n'=40 mol %/40 mol %/20 mol %, with a weight average molecular weight of 10,000, and a polydispersity [Mw (weight average molecular weight)/Mn (number average molecular weight)] of 2.0.

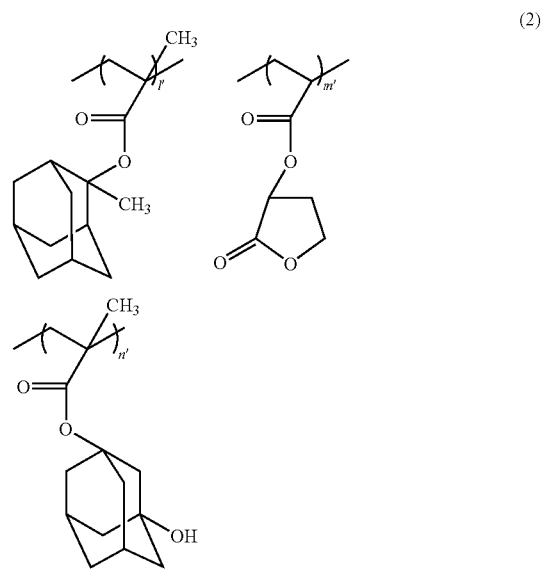

(2)

Evaluation of the level of defects, conducted in the same manner as that described above, revealed a result of 22,535 defects per 8-inch wafer.

Comparative Example 2

With the exception of using a copolymer formed from the structural units represented by a chemical formula (3) shown below (p:q:r=40 mol %:40 mol %:20 mol %, weight average molecular weight: 10,000, polydispersity: 2.1), a resist composition was produced in the same manner as the example, and subsequently evaluated for defects.

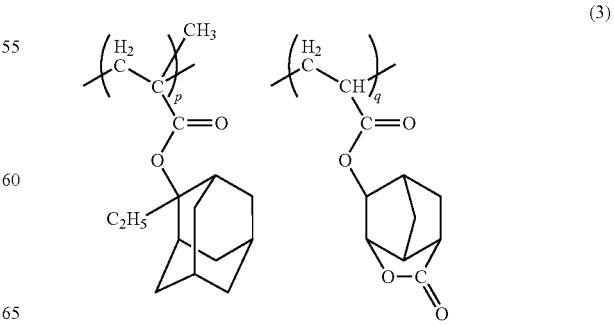

(3)

-continued

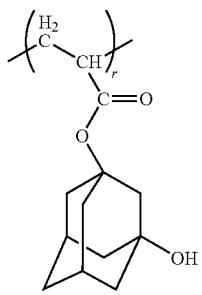

Comparative Example 3

With the exception of using a copolymer formed from the structural units represented by a chemical formula (4) shown below (p':q':r'=40 mol %:40 mol %:20 mol %, weight average molecular weight: 7,000, polydispersity: 1.5), a resist composition was produced in the same manner as the example, and subsequently evaluated for defects.

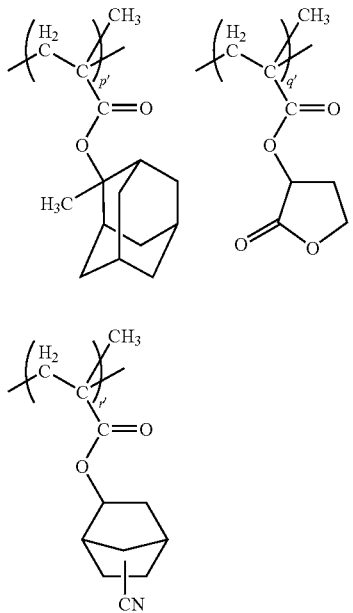

(4)

Comparative Example 4

With the exception of using a copolymer formed from the structural units represented by a chemical formula (5) shown below in which —S—CH$_2$—CH$_2$—CH$_2$—C(CF$_3$)$_2$—OH groups had been introduced at the polymer terminals in a quantity equivalent to 2 mol % relative to 100 mol % of the polymer (p":q":r"=40 mol %:40 mol %:20 mol %, weight average molecular weight: 6,500, polydispersity: 1.6), a resist composition was produced in the same manner as the example, and subsequently evaluated for defects.

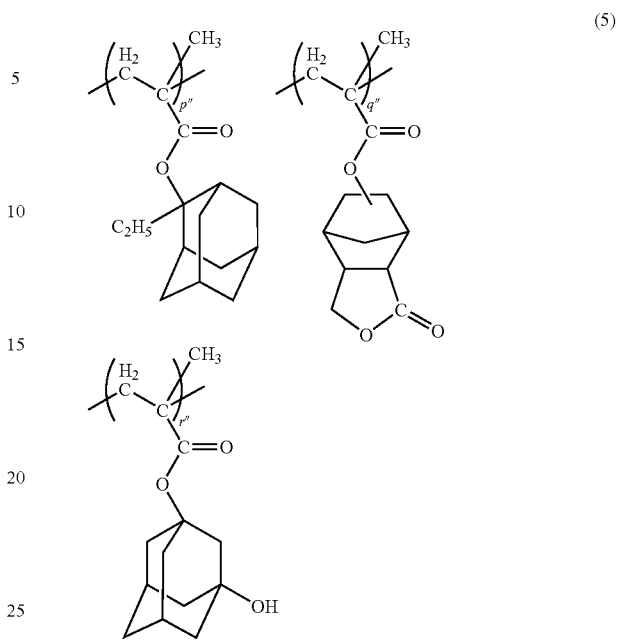

(5)

Comparative Example 5

With the exception of using a copolymer formed from the structural units represented by a chemical formula (6) shown below (p''':q''':r'''=50 mol %:40 mol %:10 mol %, weight average molecular weight: 10,000, polydispersity: 2.0), a resist composition was produced in the same manner as the example, and subsequently evaluated for defects.

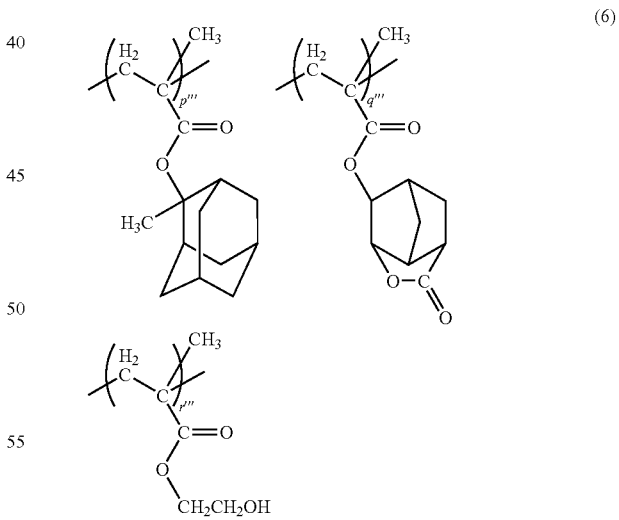

(6)

The defect evaluations are summarized in Table 1.

As is evident from the results in Table 1, amongst resist compositions formed using different structural units and different combinations of structural units, the defect evaluation result is favorable for those resist compositions for which the measured value of the contact angle is no higher than 40 degrees, but is poor for those compositions in which the measured value exceeds 40 degrees.

Furthermore, it is also clear that by applying the present invention, even a copolymer for which the measured value of the contact angle exceeds 40 degrees can be used to produce a resist composition with a favorable defect evaluation, by adjusting the contact angle for the copolymer by mixing with another copolymer.

TABLE 1

|  | Chemical formula for copolymer | Contact angle (°) | Defects (number per 8-inch wafer) |
|---|---|---|---|
| Resist composition 1 | Formula (1) | 44.45 | 27,598 |
| Resist composition 2 | Formula (1) | 33.72 | 69 |
| Resist composition 3 (Example) | Formula (1) | 38.87 | 354 |
| Comparative example 1 | Formula (2) | 51.18 | 22,535 |
| Comparative example 2 | Formula (3) | 48.06 | 7,400 |
| ~~Comparative example 3~~ | ~~Formula (4)~~ | ~~43.69~~ | ~~17,091~~ |
| Comparative example 4 | Formula (5) | 46.85 | 7,666 |
| Comparative example 5 | Formula (6) | 43.33 | 5,964 |

INDUSTRIAL APPLICABILITY

A method for producing a resist composition and a resist composition that are capable of reducing the level of defects are provided.

The invention claimed is:

1. A method for producing a resist composition including a resin component (A) that exhibits changed alkali solubility under action of acid, and an acid generator component (B) that generates acid upon exposure, the method comprising:
obtaining said component (A) by mixing a plurality of copolymers, which are composed of identical structural units but have mutually different measured values for a contact angle,
wherein mixing conditions for said plurality of copolymers are adjusted so that a measured value of a contact angle for said resist composition is no higher than 40 degrees.

2. A method for producing a resist composition according to claim 1, wherein mixing conditions for said plurality of copolymers are adjusted so that a measured value of a contact angle for said resist composition is within a range from 30 to 40 degrees.

3. A resist composition produced by a method for producing a resist composition according to claim 2.

4. A method for producing a resist composition according to claim 1, wherein said component (A) is obtained by mixing a copolymer for which a measured value of a contact angle is 40 degrees or higher, and a copolymer for which a measured value of a contact angle is less than 40 degrees.

5. A method for producing a resist composition according to claim 4, wherein said component (A) is obtained by mixing a copolymer for which a contact angle is within a range from 42 to 50 degrees, and a copolymer for which a contact angle is within a range from 30 to 36 degrees.

6. A resist composition produced by a method for producing a resist composition according to claim 5.

7. A resist composition produced by a method for producing a resist composition according to claim 4.

8. A method for producing a resist composition according to claim 1, wherein copolymers having identical ratios of said structural units are used as said plurality of copolymers.

9. A resist composition produced by a method for producing a resist composition according to claim 8.

10. A method for producing a resist composition according to claim 1, wherein a Copolymer (A1') including a structural unit (a1') derived from an (α-lower alkyl)acrylate that contains an acid dissociable, dissolution inhibiting group, and a structural unit (a2') derived from an (α-lower alkyl)acrylate that contains a lactone ring is used as said plurality of copolymers.

11. A method for producing a resist composition according to claim 10, wherein said copolymer (A1') further includes a structural unit (a3') derived from an (α-lower alkyl)acrylate that contains a polar group-containing polycyclic group.

12. A method for producing a resist composition according to claim 11, wherein said structural unit (a3') is at least one unit selected from general formulas (VIII') and (IX') shown below:

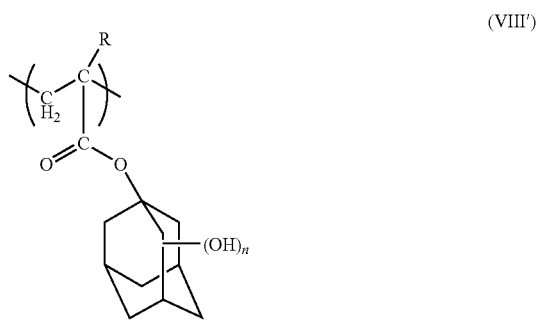

(VIII')

[wherein, R represents a hydrogen atom or a lower alkyl group, and n represents an integer from 1 to 3],

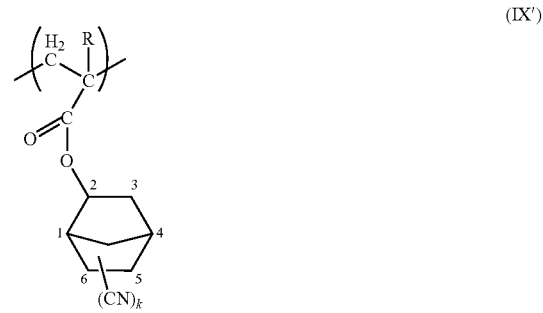

(IX')

[wherein, R represents a hydrogen atom or a lower alkyl group, and k represents an integer from 1 to 3].

13. A method for producing a resist composition according to claim 12, wherein a copolymer (A1') including at least structural units represented by a chemical formula shown below is used as said plurality of copolymers

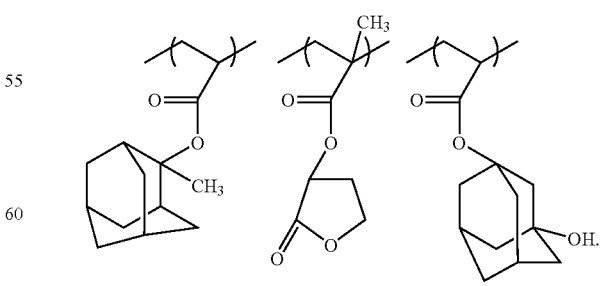

14. A method for producing a resist composition according to claim 10, wherein said structural unit (a1') is at least one unit selected from general formulas (I') through (III') shown below:

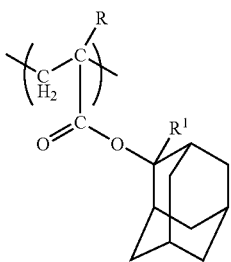
(I')

[wherein, R represents a hydrogen atom or a lower alkyl group, and $R^1$ represents a lower alkyl group],

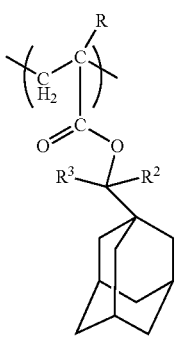
(II')

[wherein, R represents a hydrogen atom or a lower alkyl group, and $R^2$ and $R^3$ each represent, independently, a lower alkyl group],

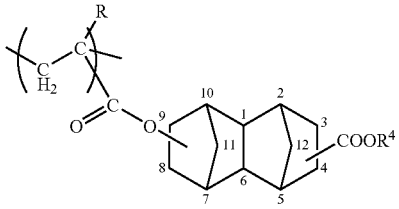
(III')

[wherein, R represents a hydrogen atom or a lower alkyl group, and $R^4$ represents a tertiary alkyl group].

15. A method for producing a resist composition according to claim 14, wherein a copolymer (A1') including at least structural units represented by a chemical formula shown below is used as said plurality of copolymers

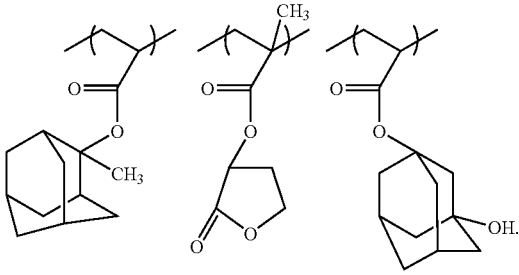

16. A method for producing a resist composition according to claim 10, wherein said structural unit (a2') is at least one unit selected from general formulas (IV') through (VII') shown below:

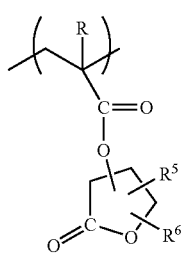
(IV')

[wherein, R represents a hydrogen atom or a lower alkyl group, and $R^5$ and $R^6$ each represent, independently, a hydrogen atom or a lower alkyl group],

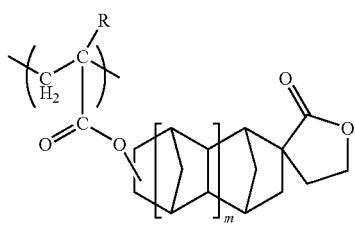
(V')

[wherein, R represents a hydrogen atom or a lower alkyl group, and m represents either 0 or 1],

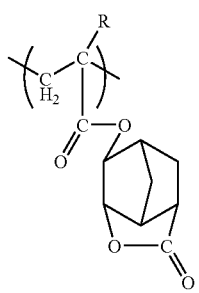
(VI')

[wherein, R represents a hydrogen atom or a lower alkyl group],

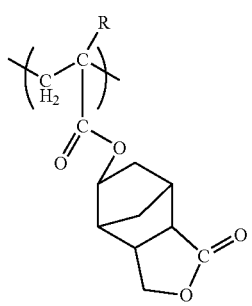
(VII')

[wherein, R represents a hydrogen atom or a lower alkyl group].

17. A method for producing a resist composition according to claim 16, wherein a copolymer (A1') including at least structural units represented by a chemical formula shown below is used as said plurality of copolymers

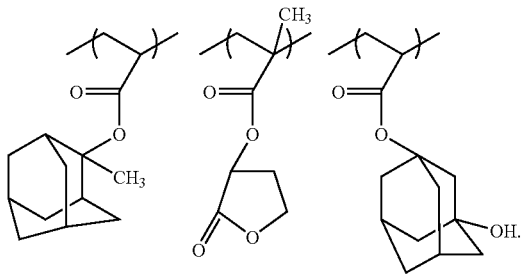

18. A method for producing a resist composition according to claim 10, wherein a copolymer (A1') in which said structural unit (a1') is derived from an acrylate ester and said structural unit (a2') is derived from an α-lower alkyl acrylate ester is used as said plurality of copolymers.

19. A method for producing a resist composition according to claim 1, wherein said resist composition further includes a nitrogen-containing organic compound (D).

20. A resist composition produced by a method for producing a resist composition according to claim 1.

* * * * *